(12) United States Patent
Laming et al.

(10) Patent No.: US 8,497,149 B2
(45) Date of Patent: Jul. 30, 2013

(54) MEMS DEVICE

(75) Inventors: Richard Ian Laming, Edinburgh (GB); Anthony Traynor, Livingston (GB)

(73) Assignee: Wolfson Microelectronics plc, Edinburgh (GB)

( * ) Notice: Subject to any disclaimer, the term of this patent is extended or adjusted under 35 U.S.C. 154(b) by 1078 days.

(21) Appl. No.: 12/280,669

(22) PCT Filed: Feb. 23, 2007

(86) PCT No.: PCT/GB2007/000636
§ 371 (c)(1), (2), (4) Date: Nov. 24, 2008

(87) PCT Pub. No.: WO2007/096636
PCT Pub. Date: Aug. 30, 2007

(65) Prior Publication Data
US 2009/0152655 A1    Jun. 18, 2009

(30) Foreign Application Priority Data
Feb. 24, 2006 (GB) .................................. 0603748.5

(51) Int. Cl.
*H01L 21/00* (2006.01)

(52) U.S. Cl.
USPC ............... 438/53; 257/419; 257/E29.324

(58) Field of Classification Search
USPC .................. 257/419, E29.324; 438/53
See application file for complete search history.

(56) References Cited

U.S. PATENT DOCUMENTS

| 5,061,049 | A | 10/1991 | Hornbeck | |
|---|---|---|---|---|
| 5,194,364 | A * | 3/1993 | Abe et al. ...................... | 430/325 |
| 6,945,115 | B1 | 9/2005 | Wang | |
| 2003/0151879 | A1 * | 8/2003 | Yang et al. .................... | 361/233 |
| 2004/0120540 | A1 * | 6/2004 | Mullenborn et al. ......... | 381/322 |
| 2005/0266599 | A1 | 12/2005 | Ikegami | |
| 2006/0211220 | A1 * | 9/2006 | Sakaya et al. ................ | 438/464 |

FOREIGN PATENT DOCUMENTS

| WO | WO 99/03146 | 1/1999 |
|---|---|---|
| WO | WO 00/05001 | 2/2000 |
| WO | WO 01/14248 | 3/2001 |
| WO | WO 03/053844 | 7/2003 |

OTHER PUBLICATIONS

Y.B. Ning et al., "Fabrication of a Silicon Micromachined Capacitive Microphone Using a Dry-Etch Process", Sensors and Actuators A, vol. 53, pp. 237-242, 1996.

(Continued)

*Primary Examiner* — Julio J Maldonado
*Assistant Examiner* — Amar Movva
(74) *Attorney, Agent, or Firm* — Dickstein Shapiro LLP

(57) ABSTRACT

A method of fabricating a micro-electrical-mechanical system (MEMS) apparatus on a substrate (10) comprises the steps of processing the substrate (10) so as to fabricate an electronic circuit (11); depositing a first electrode (15) that is operably coupled with the electronic circuit (11); depositing a membrane (16) so that it is mechanically coupled to the first electrode (15); applying a sacrificial layer (50); depositing a structural layer (18) and a second electrode (17) that is operably coupled with the electronic circuit (11) so that the sacrificial layer (50) is disposed between the membrane (16) and the structural layer (18) so as to form a preliminary structure; singulating the substrate (10); and removing the sacrificial layer (50) so as to form a MEMS structure, in which the step of singulating the substrate (10) is carried out before the step of removing the sacrificial layer (50).

30 Claims, 7 Drawing Sheets

OTHER PUBLICATIONS

A. Torkkeli et al., "Capacitive Microphone with Low-Stress Polysilicon Membrane and High Stress Polysilicon Backplate", Sensors and Actuators, vol. 85, pp. 116-123, 2000.

S. Chodhury et al., "A MEMS Implementation of an Acoustical Sensor Array", Sensing and Control, IEEE International Conferences, Taipei, Taiwan, Mar. 21-23, 2004, Piscataway, NJ, USA, IEEE, vol. 2, pp. 819-824.

Kronast, W. et al., "Single-chip condenser microphone using porous silicon as sacrificial layer for the air gap", Sensors and Actuators A vol. 87, 2001, pp. 188-193.

* cited by examiner

MEMS DEVICE

This invention relates to MEMS devices.

There is a continual drive to produce new and ever smaller transducers Micro electrical mechanical systems (MEMS) have been targeted for these applications as they are potentially small scale—of the order of tens to thousands of microns—and for their compatibility with semiconductor like processes. This leads to potentially large volume manufacture. Devices that can be achieved using these MEMS fabrication processes are, for example, pressure sensors, ultrasonic transducers and microphones. Typically these devices comprise one or more membranes with electrodes for read-out/drive deposited on the membranes and/or a substrate. In the case of MEMS pressure sensors and microphones, the read out is usually accomplished by measuring the capacitance between the electrodes. In the case of transducers, the device is driven by an applying a potential difference across the electrodes.

In the MEMS devices described above, the membranes are manufactured using a sacrificial layer, which is typically $SiO_2$. This is removed later in the process to leave the membrane suspended and free to move.

In order to incorporate the transducers into useful devices, it is necessary to interface them with external electronic circuitry. However, this can lead to problems with interference, noise and parasitic capacitance and inductance. Typically the membranes are thin, of the order microns, and can range in size from tens to thousands of microns. As a result, the devices can be fragile and may be damaged during singulation. Singulation is a process in which a substrate wafer on which the MEMS devices are fabricated is diced up so that only one device (or a group of devices) is found on each diced piece. This process is typically achieved by dicing the wafer with a high-speed rotating diamond blade. Alternatively the wafer may be cut up using a laser, or scribed and cleaved along a crystallographic axis. All of these dicing methods have associated problems when applied to MEMS structures.

During blade singulation the surface of the wafer is typically flooded with a lubricating coolant, usually water, that is meant to prevent the temperature of the wafer from becoming too high and to ensure the diamond blade stays in a safe operating range. This produces a slurry from the water and abraded pieces of wafer that may penetrate any open part of the MEMS structure and render it useless, as it is difficult to clean the slurry out at a later stage due to the small size of the singulated devices. Additionally, the lubricating coolant may be sprayed onto the wafer at high speed thus placing any delicate sensor structure under high mechanical stress and potentially damaging it.

Laser singulation is slightly cleaner than blade dicing but is more expensive. However, the heating produced by the cutting process may set up thermal gradients leading to areas of different thermal expansion in the sensor structures that may distort them and render them useless. Also the laser singulation process produces some residue that may clog any open structure and prevent the device from operating properly.

Finally, singulating the wafer by scribing and cleaving places extremely high mechanical stress on the wafer during the cleaving process and produces a large amount of debris that may damage the device as above.

WO 01/14248 identifies these issues for silicon microphones. In this application the devices are diced and then mounted/attached on a substrate carrier using a chemically resistant adhesive before the sacrificial layer is removed. After mounting on the substrate carrier, the sensor is then subjected to a chemical etching process, for example by using hydrofluoric acid, to remove the sacrificial layer. However, the chemical etching process, which requires a subsequent drying process, is severely limited in its compatibility with complementary-metal-oxide-semiconductor (CMOS) fabrication processes.

US 2005/0266599 describes a fabrication method for MEMS devices, for example accelerometers. In this arrangement, a substrate having a sacrificial layer sandwiched between two semiconductor layers i.e. a silicon-on-insulator (SOI) wafer is envisaged. The wafer is micro machined but leaving all or part of the sacrificial layer in place. The wafer is attached to an adhesive sheet and diced. The sacrificial $SiO_2$ layer is subsequently removed using a chemical etch. Use of the two semiconductor layer substrate with sandwiched oxide layer precludes its application to CMOS processes.

This invention provides a method of fabricating a microelectrical-mechanical system (MEMS) apparatus on a substrate, the method comprising the steps of: processing the substrate so as to fabricate an electronic circuit; depositing a first electrode that is operably coupled with the electronic circuit; depositing a membrane so that it is mechanically coupled to the first electrode; applying a sacrificial layer; depositing a structural layer and a second electrode that is operably coupled with the electronic circuit so that the sacrificial layer is disposed between the membrane and the structural layer so as to form a preliminary structure; singulating the substrate; and removing the sacrificial layer so as to form a MEMS structure, in which the step of singulating the substrate is carried out before the step of removing the sacrificial layer.

To reduce interference, noise and parasitic capacitance and inductance, it is desirable to integrate the membranes directly with the electronics, thus increasing sensitivity whilst also allowing a reduction in size and cost. Embodiments of the present invention provide a MEMS fabrication process in which the processes and materials involved in the fabrication of the MEMS membranes are compatible with (CMOS) fabrication processes. The MEMS fabrication process is thus restricted to, for example, temperatures below 400° C. and precludes the use of gold In a preferred embodiment a CMOS compatible process for defining membrane structures is described.

It will be appreciated that the term "singulation" may refer to a process which results in one MEMS device per diced piece or alternatively a group of MEMS devices per diced piece.

Various further respective aspects and features of the present invention are defined in the appended claims.

Preferred embodiments of the invention will now be described with reference to the accompanying drawings in which.

Figure 1:
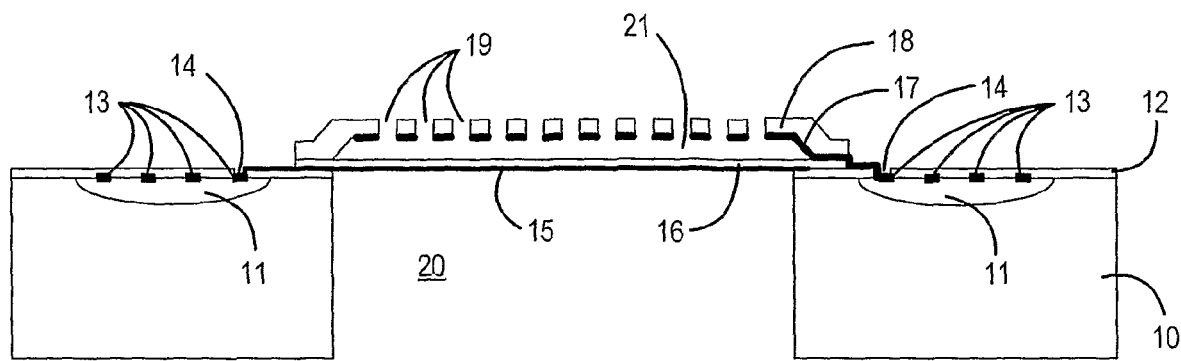
FIG. 1 is a schematic cross-sectional view of a MEMS microphone manufactured according to an embodiment of the invention.
Figure 2:
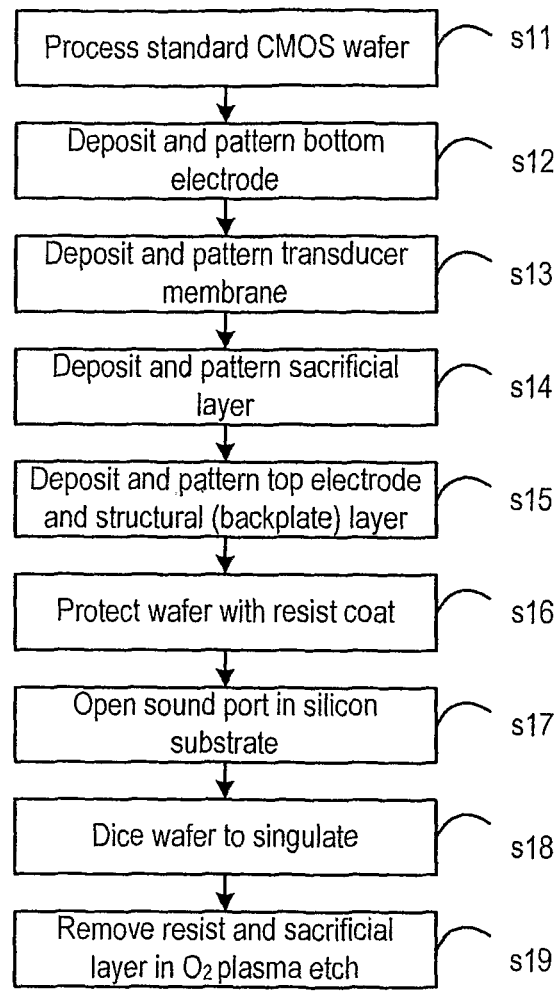
FIG. 2 is a flow chart illustrating steps in a fabrication process for the MEMS microphone in FIG. 1.

FIG. 1 shows a cross-sectional view of a MEMS device that may be manufactured according to an embodiment of the invention. The MEMS device is a capacitively coupled microphone that is operably coupled to circuit regions 11. The device is fabricated from a silicon substrate 10. (In this example, for integration with CMOS electronics the substrate is silicon, but it will be appreciated that other substrate materials and electronic fabrication techniques could be used instead.

In order to process an electrical output signal from the microphone, the device has circuit regions 11 fabricated by standard CMOS processes on the substrate. The circuit regions comprise aluminium circuit interconnects 13 that are used to electrically connect to the microphone via interconnect points 14. To protect the circuit regions from damage, a silica based insulating and protective layer 12 covers the circuit regions and the rest of the substrate.

The microphone is formed from a suspended membrane 16 that is mechanically coupled to electrodes 15 and 17. Interposed between the electrodes is an air gap 21 to allow the membrane 16 to move freely in response to pressure differences generated by sound waves. A lower electrode 15 connects to one of the circuit regions 11 via one of the interconnect points 14. The lower electrode is mechanically coupled to the membrane 16 which is suspended across a hole 20 in the substrate 10. The hole 20 is in fact sealed in use by virtue of the fact that the MEMS device is mounted on a carrier, but this does not significantly impede its operation (as a hole) because the large back-volume between the membrane and such a carrier presents a low resistance and enables the lower membrane to move freely in response to differential pressure differences generated by sound waves. Suspended above the membrane and attached to a generally rigid structural layer or backplate 18 is a second electrode 17. This is mechanically coupled to the backplate and connected to one of the circuit regions 11 via one of the interconnect points 14. To prevent the formation of a small sealed cavity that would impede the microphone from operating correctly, vent holes 19 are arranged in the backplate 18 so as to allow free movement of air molecules.

The operation of the microphone will now be briefly described. In response to a sound wave corresponding to a longitudinal pressure wave incident on the microphone, the membrane 16 is deformed slightly from its equilibrium position. The distance between the lower electrode 15 and upper electrode 17 is correspondingly altered, giving rise to a change in capacitance between the two electrodes that is subsequently detected by the circuit regions 11.

The process by which the above embodiment may be fabricated will now be described with reference to FIGS. 2-10 and with reference to elements as disclosed above.

Figure 3:
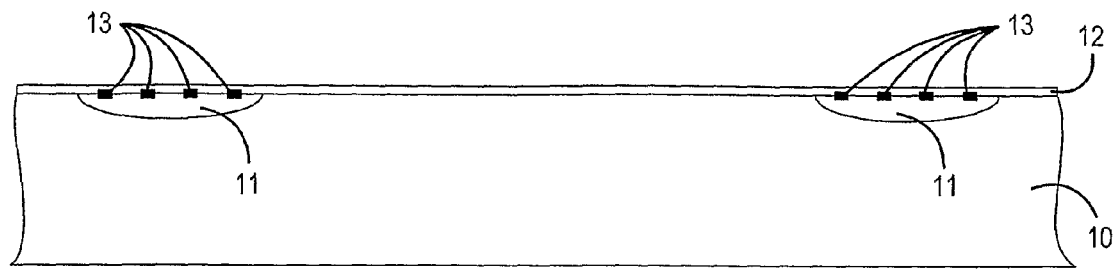
FIGS. 3, 4, 5, 6, 7, 8, 9 and 10 are schematic cross sectional views illustrating the fabrication process detailed in FIG. 2.
Figure 4:
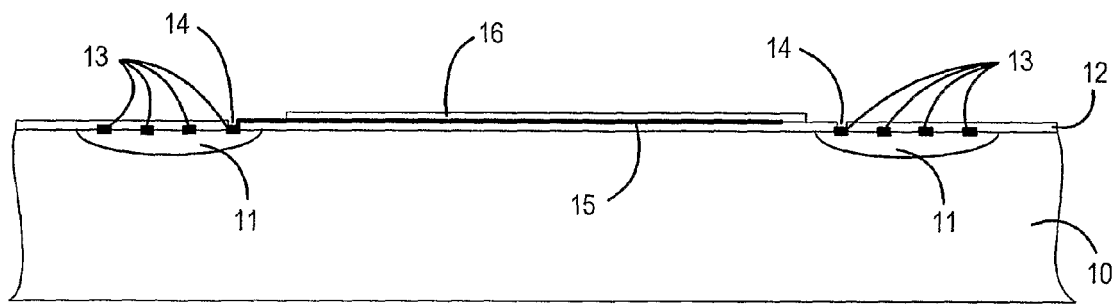

In a step s11 and as shown in FIG. 3, a CMOS silicon wafer 13 is processed to fabricate circuit regions 11 using standard processing techniques such as ion implantation, photomasking, metal deposition and etching. The circuit regions comprise any circuit operable to interface with a MEMS microphone. For example, the circuit may be a pre-amplifier connected so as to amplify an output of the microphone. In addition the circuit may contain a charge-pump to generate a bias, typically around 10 volts, across the two electrodes. This has the effect that changes in the electrode separation then change the device capacitance; assuming constant charge, the voltage on the output terminal is correspondingly changed. A high impedance pre-amplifier can then detect such a change in voltage.

The circuit regions may optionally comprise an analogue-to-digital converter to convert the output of the microphone or an output of the pre-amplifier into a digital signal, and optionally a digital signal processor to process or part-process such a digital signal. Furthermore, the circuit may comprise a digital-to-analogue converter and/or a transmitter/receiver suitable for wireless communication. However, it will be appreciated by one skilled in the art that many other circuit arrangements operable to interface with a MEMS microphone may be envisaged.

The contacts/interconnects 13 of the circuit regions 11 are typically made by sputtering aluminium. The contacts/interconnects are then protected from damage by further processing steps with a silica based insulating and protective layer 12. An etch stop layer in the form of, for example, plasma enhanced chemical vapour deposition (PECVD) deposited silicon nitride or silica is included as part of the CMOS fabrication process. (Note that the layer might not be pure silica—BoroPhosphoSilicate Glass or BPSG is a possibility as it can be deposited at lower temperatures).

For the example device the upper electrode 17 and also the electrode 15 below the silicon nitride membrane 16 are aluminium. In this case the electrode could be attacked by the back-hole etching process and so to protect it an etch-stop layer could be included, to be removed later in the process with a simple wet etch process following the hole etch.

To enable electrical contact to be made between the MEMS microphone and the circuit regions, contact points are opened up in the doped silica layer by patterning with resist and dry etching through using a $CF4/H_2$ gas mix to expose the interconnect points 13 as shown in FIG. 3. The bottom electrode 15 is then deposited at a step s12, typically by sputtering aluminium. Alternatively, the bottom electrode 15 may be deposited during the fabrication of the circuit regions 11 at step s11. Depositing the electrode by sputtering is preferable to other methods such as thermal evaporation due to the low substrate temperatures used. This ensures compatibility with CMOS fabrication processes. In addition, where materials other than aluminium are deposited, this method benefits from the ability to accurately control the composition of the thin film that is deposited. Sputtering deposits material equally over all surfaces so the deposited thin film has to be patterned by resist application and dry etching with a $Cl_2/BCl_3$ gas mix to define the shape of the lower electrode 15 as well as to define the interconnect points 14 that allow interconnection to the underlying CMOS circuit. The lower membrane 16 is then deposited at a step s13 via plasma enhanced chemical vapour deposition (PECVD) at 300° C. with Silane ($SiH_4$), Ammonia ($NH_3$) and nitrogen ($N_2$) with flow rates of 40,40 and 1400 sccm (standard cubic centimeters/minute) respectively. The RF power can be 20 W and can be alternated every 6 seconds between a high frequency (13.56 MHz) and a low frequency (400 kHz). To define the shape of the lower membrane 16 it is patterned by photoresist and dry etched using $CF4/H_2$ gases.

Figure 5:
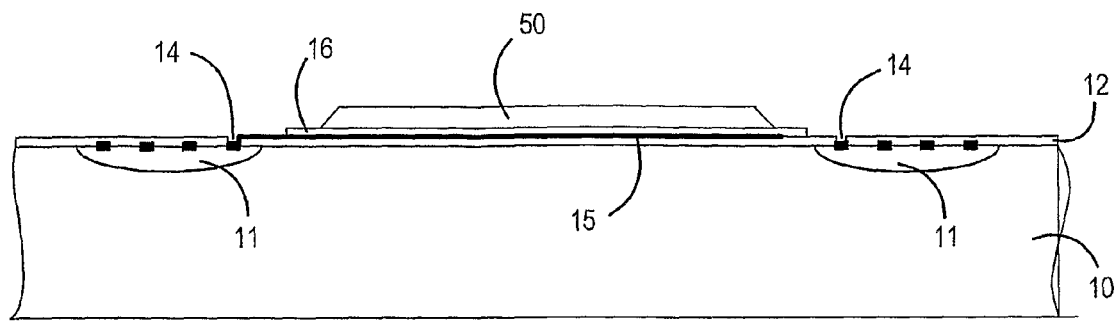

In order to create the suspended membranes, a sacrificial layer 50 is used in the microphone manufacturing process. This layer is deposited as shown in FIG. 5 and then removed at a step s19 in order to define a cavity. To ensure compatibility with CMOS fabrication techniques, the sacrificial layer 50 can be made of a number of materials which can be removed using a dry release process. This is advantageous in that no additional process steps or drying are required after the sacrificial layer is released. Polyimide is preferable as the sacrificial layer as it can be spun onto the substrate easily and removed with an $O_2$ plasma clean. During this, oxygen is introduced into a chamber in which the substrate is placed and a plasma set up. The oxygen in the plasma reacts with the organic sacrificial layer to form volatile oxides which can then be removed from the chamber.

In a step s14, a layer of polyimide is spun on the wafer to form a conformal coating, typically 1-2 microns thick. It is subsequently cured at 200° C. for 30 minutes in air at atmospheric pressure and then at 300° C. for 30 minutes in a flowing nitrogen environment at atmospheric pressure. It will be appreciated by a person skilled in the art that the values of these parameters are exemplary only and that any conditions suitable to deposit a polyimide sacrificial layer on a silicon substrate may be envisaged. The polyimide layer is then patterned with photoresist and etched in an oxygen plasma. This defines the shape of the cavity between the two membranes that will be left behind when the sacrificial layer is removed.

Figure 6:
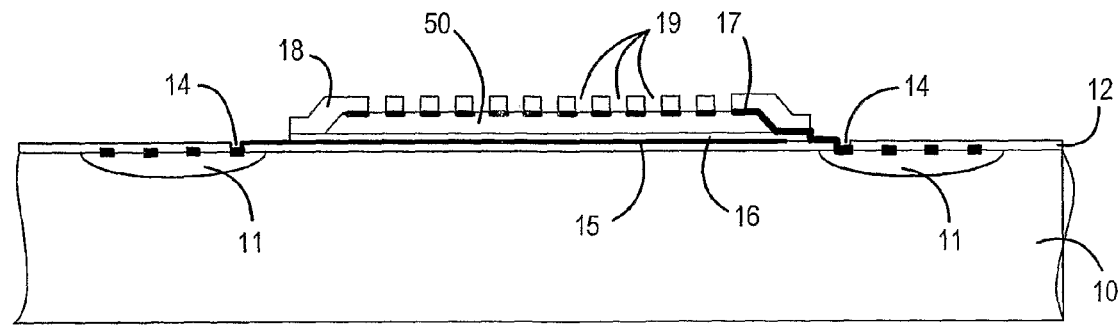
Figure 7:
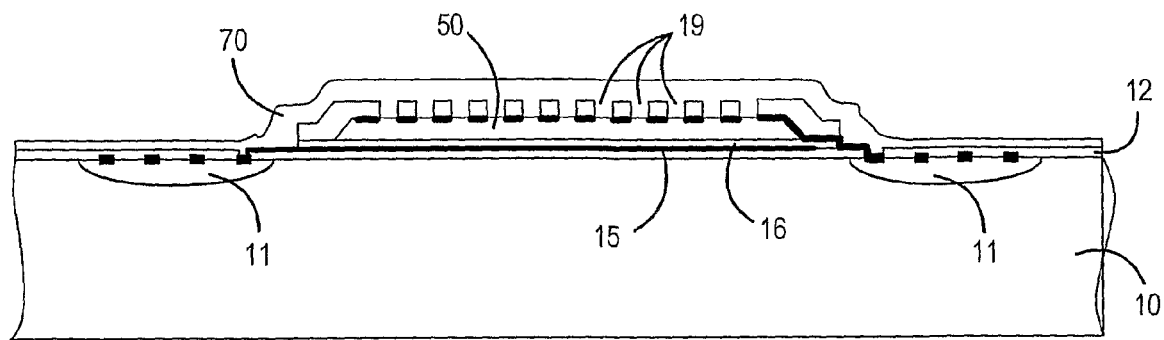

At a step s15 and as shown in FIG. 6, a top electrode 17 and rigid silicon nitride structural layer or back plate 18 are deposited and patterned. The aluminium electrode is deposited by sputtering whilst the silicon nitride is deposited in a similar way to the membrane, however with a slightly increased tensional stress and thickness of ~2-5 microns. The top electrode 17 is typically deposited by sputtering aluminium. The backplate 18 is patterned and etched using photoresist and dry etch in a similar manner to that described above to define vent holes 19 which allow the free passage of air in and out of the cavity so that the lower membrane can flex in response to a sound wave. In order to protect the membranes during subsequent processing stages, the top of the wafer is spun coated at a step s16 with resist, for example Shipley SJR220-7, which is typically a few microns thick. Standard manufacturers' curing recipes are adopted for these materials. As well as protecting the membranes from damage, the resist layer prevents the vent holes from being clogged by any debris that might be produced during the singulation process.

Figure 8:
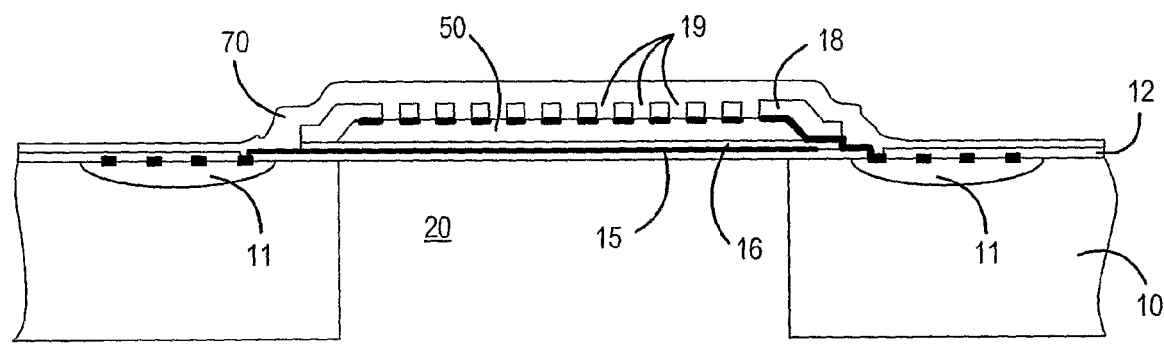
Figure 9:
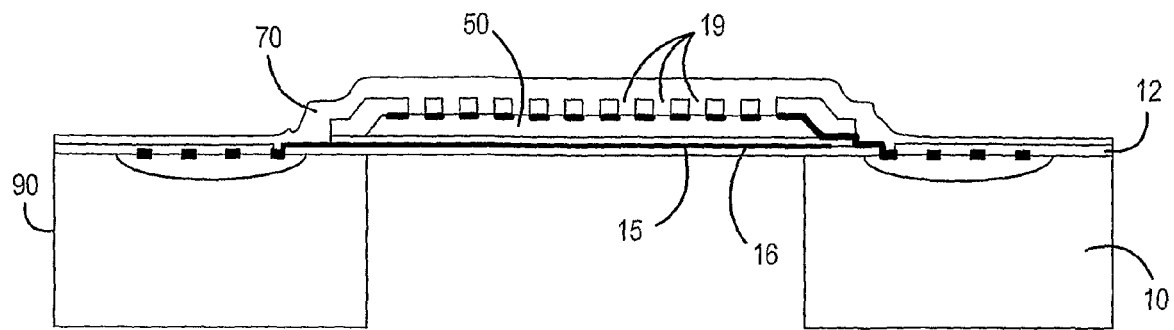
Figure 10:
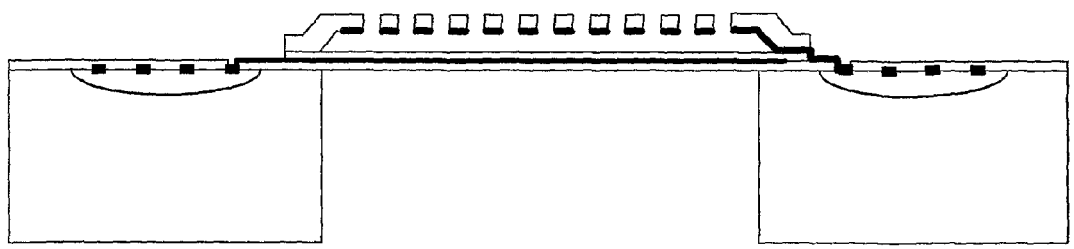

To allow the bottom membrane freedom to flex in response to a sound wave, the side of the substrate that is diametrically opposite from the circuit regions 11 and backplate layer 18 is now patterned with thick (~8 micron) resist and dry etched using a $SF_6/C_4F_8$ gas combination in a reactive ion etch using a Surface Technology Systems Inductively Coupled Plasma (STS ICP) machine to create a sound port 20 as shown in FIG. 8 and at a step s17. Alternatively the etching of the substrate to form the sound port 20 can be carried out using a wet etch. In this case the back of the wafer is again patterned with resist, and this pattern is then transferred to a thin layer, native thermal oxide or silicon nitride on the back of the wafer and which is not attacked by the wet etch chemical. The mask pattern will typically be square and aligned to the wafer crystal planes. The wet etch is performed using an aqueous solution of 22% tetramethylammonium hydroxide (TMAH) and 78% water and results in a smaller but square opening at the membrane.

At a step s18 the substrate containing the silicon MEMS microphones is diced up so that there is only one device (or a functional group of devices) per diced piece, in a process known as singulation. Note that in this context a device comprises the MEMS transducer and circuit regions as described above. This is done before the sacrificial layer is removed at a step s19. This embodiment of the method is advantageous in that the sacrificial layer 50 provides mechanical support for the delicate membrane structures during singulation and the resist coat 70 prevents the vent holes 19 from being clogged or damaged by any debris that may be produced in the singulation process.

The method of singulating the substrate can be one of the following: dicing with a high speed diamond blade; laser cutting; or scribing the substrate and cleaving the substrate along a crystallographic orientation. The singulation is carried out by attaching the underneath side of the substrate to a carrier that will be used to support the substrate during singulation. The substrate is typically attached to the carrier using high temperature dicing tape. The dicing tape may be any adhesive tape suitable to survive the process in which the sacrificial layer is removed. During singulation, the intact sacrificial layer 50 provides strength and protection to the membrane layers and the resist layer 70 prevents the vent holes 19 from becoming clogged by debris resulting from the singulation process. After singulation, there is only one device per diced piece which is defined by substantially straight edges 90.

Figure 11:
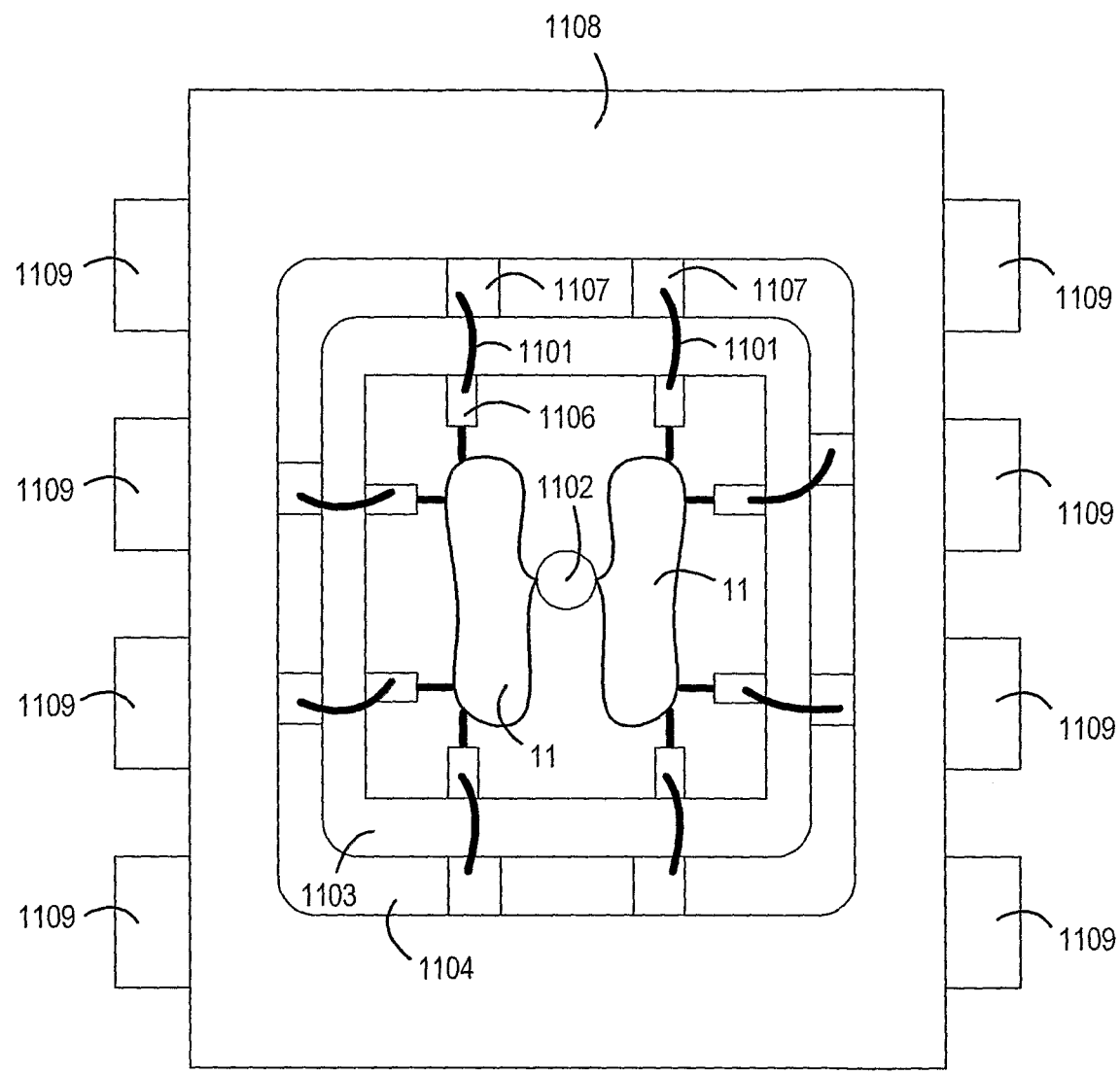
FIG. 11 shows a schematic plan view of the embodiment shown in FIG. 1 mounted in a carrier package.

At step s19 the sacrificial layer is removed in a so-called ashing process. This is where the singulated substrate, still on the dicing tape, is attached to a dicing frame and processed in an $O_2$ plasma system to remove the protective resist and the polyimide. Typically the conditions used for this process are a temperature of 100° C. in an $O_2$ plasma for ~3 hours (40% $O_2$, radiofrequency power 350 W, magnetic field 660 mT). However, a person skilled in the art will appreciate that any conditions suitable to remove a polyimide sacrificial layer may be envisaged. Finally, the finished MEMS microphones are removed from the dicing tape and mounted in a package 1108 as shown in FIG. 11. This is achieved using an automated pick and place system that lifts a microphone chip 1100 from the dicing tape and places it in the package 1108 suitable for electrical connection to any device operable to interface with the microphone.

A schematic plan view of a MEMS microphone fabricated according to the embodiment described above is shown in FIG. 11. The microphone chip 1100 is stuck to a chip mounting area 1103 on the package 1108 with a suitable adhesive thus forming the back cavity. A microphone 1102 is operably connected to circuit areas 11 to chip contact pads 1106 on the microphone chip 1100. The chip contact pads 1106 are wire bonded to package contact pads 1107 in a package contact pad area 1104 using electrically conductive wires 1101. For example, the electrically conductive wires 1101 may be gold. Alternatively, they may be aluminium. However, a person skilled in the art will realise that any material suitable for wire bonding may be used to electrically connect the chip contact pads 1106 to the package contact pads 1107. The package contact pads are operably connected to package contacts 1109 to enable the package to be operably connected to a printed circuit board. Although the package 1108 has eight package contacts 1109, a person skilled in the art will realise that any number of package contacts 1109 and package contact pads 1107 may be provided in the package 1108.

Typical dimensions of the microphone are: diameter ~1 mm, membrane thickness (see below) ~0.3-1 micron, electrodes ~0.1 micron thick, backplate ~2-5 micron thick.

A person skilled in the art will appreciate that the above description of the preferred embodiment is not limited to the fabrication of MEMS microphones. For example, the method described in the embodiment above may be modified so that step s17, where a hole is etched in the underside of the substrate, is omitted from the process so as to fabricate an ultrasonic transducer. Without the backhole the backplate and electrode 18 effectively becomes the membrane. With an appropriate choice of dimensions (preferably thinner than the dimensions set out above) this backplate/electrode arrangement can be driven as an ultrasonic transducer. Re-sealing of the holes would allow operation also as an immersion transducer. Again without the backhole and with re-sealed membranes the capacitance will become sensitive to absolute pressure rather than differential pressure. Furthermore, the method described in the embodiment above may be used to fabricate a pressure sensor or fabricate an array on a substrate, the array comprising any or all of: a microphone; an ultrasonic transducer; and a pressure sensor. The array, combined with appropriate electronics and signal processing could provide a directionally selective microphone.

The invention claimed is:

1. A method of fabricating a plurality of micro-electrical-mechanical system (MEMS) device on a substrate, the method comprising the steps of:
   processing the substrate so as to fabricate a plurality of electronic circuits;
   depositing a plurality of first electrodes such that each first electrode is operably coupled with a respective electronic circuit;
   depositing a plurality of membranes so that each membrane is mechanically coupled to a respective first electrode;
   applying a plurality of sacrificial layers such that each sacrificial layer is deposited over a respective membrane;
   depositing a plurality of structural layers and a plurality of second electrodes that are operably coupled with the electronic circuits so that the sacrificial layers are disposed between the respective membranes and the respective structural layers so as to form a preliminary structure;
   singulating the substrate so as to form the plurality of separate MEMS devices, each MEMS device comprising a preliminary structure formed on a respective portion of the substrate; and
   removing the sacrificial layer from the separate MEMS devices, in which the step of singulating the substrate is carried out before the step of removing the sacrificial layer.

2. A method according to claim 1, in which the step of fabricating the electronic circuit is carried out using a complementary-metal-oxide-semiconductor (CMOS) process.

3. A method according to claim 1, in which the sacrificial layer is polyimide.

4. A method according to claim 3, comprising the step of removing the polyimide by a plasma oxygen etch process.

5. A method according to claim 4, further comprising the step of exciting the plasma using microwaves.

6. A method according to claim 1, comprising the step of applying a resist coat to the preliminary structure.

7. A method according to claim 6, comprising the step of applying oxygen plasma etching to remove the resist coat.

8. A method according to claim 7, further comprising the step of exciting the plasma using microwaves.

9. A method according to claim 1, in which the step of singulating the substrate comprises cutting the substrate using a dicing saw.

10. A method according to claim 1, in which the step of singulating the substrate comprises scribing the substrate and cleaving the substrate using mechanical force.

11. A method according to claim 1, in which the step of singulating the substrate comprises cutting the substrate using laser dicing.

12. A method as claimed in claim 1, comprising:
   attaching the substrate to a carrier; and thereafter,
   singulating the substrate.

13. A method as claimed in claim 12, comprising:
   attaching the substrate to the carrier using dicing tape.

14. A method as claimed in claim 13, wherein the step of removing the sacrificial layer is performed after attaching the substrate to the carrier, and before singulating the substrate.

15. A method as claimed in claim 1, further comprising:
   before singulating the substrate, applying a resist coating layer; and
   after singulating the substrate, removing the sacrificial layer and the resist coating layer in a single processing step.

16. A method as claimed in claim 15, wherein the step of removing the sacrificial layer and the resist coating layer comprises using a dry etch process.

17. A method as claimed in claim 16, wherein the step of removing the sacrificial layer comprises using an $O_2$ plasma.

18. A method according to claim 1, in which the step of depositing the first electrode occurs during the step of fabricating the electronic circuit.

19. A method according to claim 1, in which the electronic circuit comprises a pre-amplifier.

20. A method according to claim 1, in which the electronic circuit comprises an analogue-to-digital converter.

21. A method according to claim 1, in which the electronic circuit comprises a digital-to analogue converter.

22. A method according to claim 1, in which the electronic circuit comprises transmitting and receiving means.

23. A method according to claim 1, in which the electronic circuit comprises a charge-pump.

24. A method according to claim 1, in which the electronic circuit comprises a digital signal processor.

25. A method according to claim 1, comprising the step of etching a hole through the substrate so as to reveal the membrane.

26. A method according to claim 1, in which the structural layer is a second membrane.

27. A method according to claim 26, in which the second membrane is silicon nitride.

28. A method according to claim 1, in which the first and the second electrodes are aluminum.

29. A method according to claim 1, comprising the step of protecting the electronic circuit with an insulating and protecting layer.

30. A method according to claim 28, in which the insulating and protecting layer is Silica.

* * * * *

UNITED STATES PATENT AND TRADEMARK OFFICE
CERTIFICATE OF CORRECTION

PATENT NO.       : 8,497,149 B2
APPLICATION NO. : 12/280669
DATED            : July 30, 2013
INVENTOR(S)      : Laming et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1292 days.

Signed and Sealed this

Fifteenth Day of September, 2015

Michelle K. Lee
*Director of the United States Patent and Trademark Office*